(12) United States Patent
Yokoi

(10) Patent No.: US 6,420,739 B1
(45) Date of Patent: Jul. 16, 2002

(54) GAAS SEMICONDUCTOR DEVICE HAVING A CAPACITOR

(75) Inventor: Yasushi Yokoi, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/302,141

(22) Filed: Apr. 29, 1999

(30) Foreign Application Priority Data

May 19, 1998 (JP) ............................................. 10-155196

(51) Int. Cl.[7] .......................... H01L 29/76; H01L 29/94; H01L 31/062; H01L 31/113; H01L 31/119
(52) U.S. Cl. .......................... 257/289; 257/12; 257/532; 257/533; 257/535
(58) Field of Search ................................ 257/532, 533, 257/535, 12, 19, 289

(56) References Cited

U.S. PATENT DOCUMENTS

| | | | |
|---|---|---|---|
| 4,876,176 A | * 10/1989 | Calviello et al. | 430/311 |
| 4,959,705 A | * 9/1990 | Lemnios et al. | 357/51 |
| 5,229,309 A | 7/1993 | Kato | 437/43 |
| 5,841,160 A | * 11/1998 | Nakamura | 257/295 |
| 5,929,473 A | 7/1999 | Nishihori et al. | 257/277 |
| 5,986,301 A | * 11/1999 | Fukushima et al. | 257/306 |
| 6,075,266 A | * 1/2000 | Yoshitomi | 257/306 |
| 6,104,049 A | * 8/2000 | Solayappan et al. | 257/295 |

FOREIGN PATENT DOCUMENTS

| | | |
|---|---|---|
| JP | 58-064048 | 4/1983 |
| JP | 62-046551 | 2/1987 |
| JP | 290561 | 3/1990 |
| JP | 05-226582 | 9/1993 |
| JP | 06-252357 | 9/1994 |
| JP | 07-321289 | 12/1995 |
| JP | 09-102585 | 4/1997 |

OTHER PUBLICATIONS

Korea Patent Office—Opinion Submission Notification (Office Action), Mar. 24, 2001.

* cited by examiner

*Primary Examiner*—Eddie Lee
*Assistant Examiner*—Jesse A. Fenty
(74) *Attorney, Agent, or Firm*—Ostrolenk, Faber, Gerb & Soffen, LLP

(57) ABSTRACT

A semiconductor device includes a capacitor having a pair of electrodes opposite to each other through a dielectric layer, and an element other than the capacitor, both of which are formed on a semiconductor substrate. An ohmic electrode of the element and one of the electrodes of the capacitor are formed of the same metallic material.

6 Claims, 7 Drawing Sheets

GAAS SEMICONDUCTOR DEVICE HAVING A CAPACITOR

BACKGROUND OF THE INVENTION

1. Field of the Invention

The present invention relates to a semiconductor device, and more particularly, to a semiconductor device having a capacitor.

2. Description of the Related Art

A conventional semiconductor device having an FET (field effect transistor), a semiconductor resistor element, and an MIM (Metal-Insulator-Metal) capacitor will be described below with reference to FIGS. 1A through 1H. First, Si is doped in the surface layer of a semi-insulating GaAs substrate 1 by ion implantation, and activated by annealing to form an active layer (n-type region) 2 and a semiconductor resistor element (n-type region) 3. Further, Si is doped at a high concentration in the opposite side areas of each of the active layer 2 and the semiconductor resistor layer 3, and activated by annealing to form contact layers ($n^+$ regions) 4, 5 (FIG. 1A).

After the active layer 2, the semiconductor resistor layer 3, and the contact layers 4, 5 are formed, an SiNx layer 6 is formed on the whole surface of the GaAs substrate 1 (FIG. 1B). The SiNx film 6 is selectively removed by photolithography and an etching process to provide openings 7 in the areas thereof where the ohmic electrodes and the Schottky electrode of an FET and the ohmic electrodes of the semiconductor resistor element are to be formed (FIG. 1C). Succeedingly, by the processes such as photolithography, vapor deposition, lifting-off, and the like, ohmic electrodes 8, 9 made of a type of AuGe/Ni are formed on the respective contact layers 4, 5. After the ohmic electrodes 8, 9 are heat treated, a Schottky electrode 10 is formed on the active layer 2 (FIG. 1D). Thus, the FET 11 and a semiconductor resistor element (implant resistor) 12 are formed into the surface of the GaAs substrate 1.

Thereafter, a photoresist 13 is applied to the whole surface of the GaAs substrate 1. An opening is formed in the area of the photoresist 13 where the lower-side electrode of the capacitor is to be formed. An electrode material 14 comprising Ti/Pt/Au is sequentially vapor-deposited thereon (FIG. 2E). Succeedingly, the photoresist 13 is removed by a lifted-off method, and thereby, a lower layer electrode 15 made of Ti/Pt/Au is formed on the SiNx film 6 (FIG. 2F). Succeedingly, the whole surface of the GaAs substrate 1 including the lower layer electrode 15 is covered with an SiNx film 16. An opening 17 for wiring the lower layer electrode 15 is formed in the SiNx film 16 (FIG. 2G). Then, by processes such as photolithography, vapor deposition, lifting-off, and the like, an upper layer electrode 18 made of Ti/Au or Ti/Pt/Au is formed on the SiNx film 16 in the capacitor area (FIG. 2H). Thus, on the GaAs substrate 1, formed is an MIM capacitor 19 containing the upper layer electrode 18 and the lower layer electrode 15 opposite to each other through the SiNx film (dielectric layer) 16.

Ohmic electrodes for used with a field effect transistor (FET), a heterojunction bipolar transistor (HBT), a diode (Schottky barrier diode), a semiconductor resistor (an epitaxy resistor, an injected resistor), and the like, formed on a semiconductor substrate, are used in order to obtain an ohmic contact with the semiconductors (active layers). For this purpose, it is required to carry out the alloying by heat treatment, so-called alloying, by which a part of the ohmic electrodes are diffused in the semiconductors. By the alloying heat treatment, the ohmic electrodes have a larger surface roughness (morphology), as compared with those not heat treated for alloying. This will exert an influence over the breakdown voltage characteristics and the like. Accordingly, it has been thought that the ohmic electrodes are unsuitable for ordinary wiring. Particularly, the ohmic electrodes have never been formed on insulating films, since their purpose is to provide an ohmic contact with the semiconductors.

For a capacitor, its upper layer and lower layer electrodes are formed on an insulation film. Accordingly, the upper layer and lower layer electrodes, which are required to have high breakdown voltage characteristics, were not formed with the same metallic material as that of the ohmic electrodes, but with a metallic material (for example, Ti/Au or Ti/Pt/Au) different from that of the ohmic electrodes.

Thus, in the conventional semiconductor device, the upper layer and lower layer electrodes of the capacitor were formed with a metallic material different from that of an element such as FET, a diode, or the like and by a process different from that for the elements. This complicated the production process for the semiconductor device, and affected the reliability of its electric characteristics.

SUMMARY OF THE INVENTION

In view of the foregoing, the present invention has been devised, the object of which is to simplify the process of producing a semiconductor device, and to improve the reliability of its electric characteristics by formation of the upper layer electrode or the lower layer electrode of the capacitor with the same metal material as that of the ohmic electrode(s).

A semiconductor device according to the present invention includes a capacitor having a pair of electrodes opposite to each other through a dielectric layer, and an element other than a capacitor, both of which are formed on a semiconductor substrate, wherein an ohmic electrode of the element and one of the electrodes of the capacitor are formed with the same metallic material.

According to the present invention, one of the electrodes of the capacitor is formed with the same metallic material as that of the ohmic electrode. Therefore, the one of the electrodes of the capacitor, together with the ohmic electrode, can be simultaneously formed by the same process. Thus, the process parameters (photolithographic conditions, vapor deposition conditions, and the like) to be controlled in the process of forming the electrodes can be reduced. That is, according to the present invention, the number of processes and the control parameters required for the formation of the electrodes of an element such as an FET or the like and the capacitor can be reduced, the production process for the semiconductor device can be simplified, and the production cost can be reduced. In addition, variations in the electrical characteristics of the semiconductor device can be decreased, and the reliability of the electrical characteristics can be enhanced, due to the simplified production process and the reduced number of control parameters.

Preferably, the electrode of the capacitor made of the same metallic material as that of the ohmic electrode is formed on the upper side of an insulating film formed above the semiconductor substrate. However, the electrode of the capacitor may be formed directly on the semiconductor substrate.

According to the knowledge obtained experimentally by the inventor of the present invention, the surface roughness of the ohmic electrode, which was formed on an insulating film (for example, an SiNx film, an $SiO_2$ film, an SiON film, or the like), suffered substantially no changes by the alloying heat treatment. In addition, it has been revealed that the adhesion of the ohmic electrode to the insulating film becomes higher, as compared with that before the heat treatment.

Thus, owing to the formation of the electrode of the capacitor on the insulating film, the electrode of the capacitor, though it is formed with the same metallic material as the ohmic electrode, can be rendered a smooth-surface without the deterioration of the surface roughness, which will caused by the heat treatment, and the reliability of the capacitor characteristics such as the withstand voltage characteristics and the like can be sufficiently enhanced.

Further, the lower layer electrode was formed with the same metallic material as the ohmic electrode on the semi-conductor substrate, not on the insulating film, and the capacitor characteristics were investigated. As a result, the capacitor characteristics comparable to those of a conventional MIM capacitor could be obtained. Particularly, the withstand voltage characteristics were not different, though they were conventionally thought to reflect on the difference between the surface roughnesses.

Preferably, the ohmic electrode and the electrode of the capacitor made of the same metallic material are heat treated at a temperature of from 350° C. to 450° C. This temperature condition is ordinarily used for the heat treatment of the ohmic electrode. This means that the conventional temperature condition for the ohmic electrode is neither changed nor complicated.

The electrode of the capacitor made of the same material as the ohmic electrode may contain Au, Ge, and Ni. It is not necessary to use an especial metallic material for the ohmic electrode.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

DETAILED DESCRIPTION OF PREFERRED EMBODIMENTS

Hereinafter, the preferred embodiments of the present invention are explained in detail with reference to the drawings.

First Embodiment

Figure 1A:
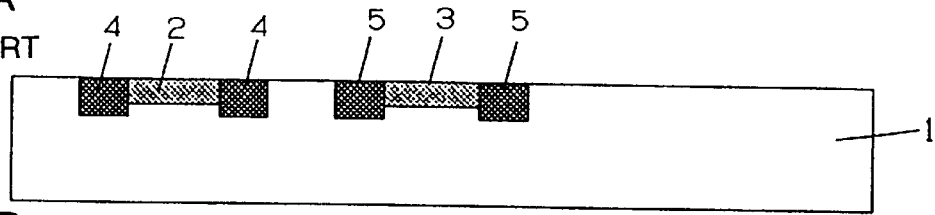
FIGS. 1A through 1H are schematic sectional views illustrating the structure and a production method for an example of conventional semiconductor devices.
Figure 1B:
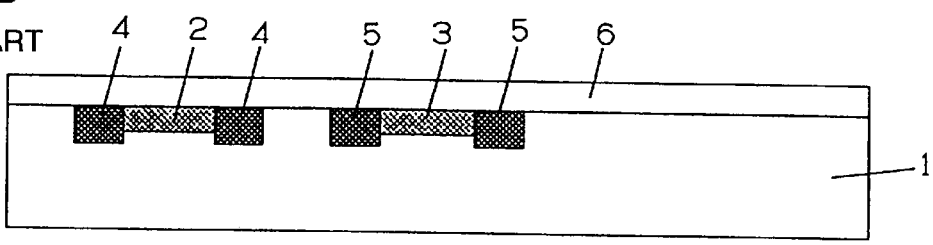
Figure 1C:
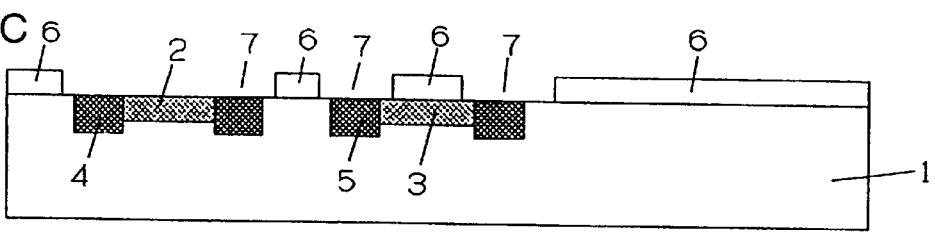
Figure 1D:
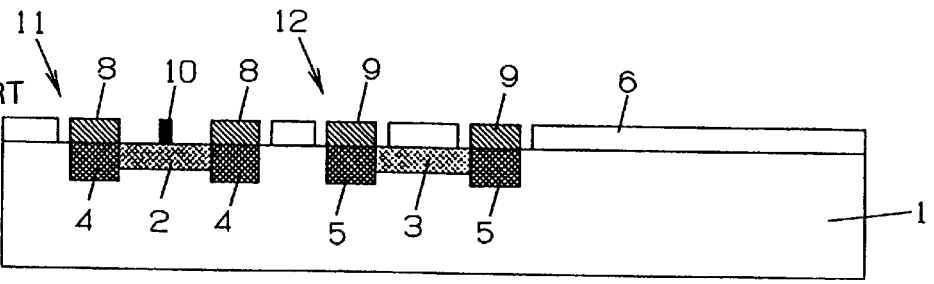
Figure 1E:
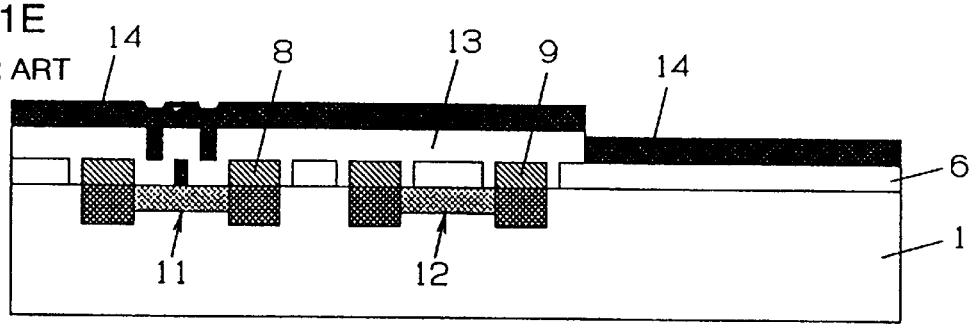
Figure 1F:
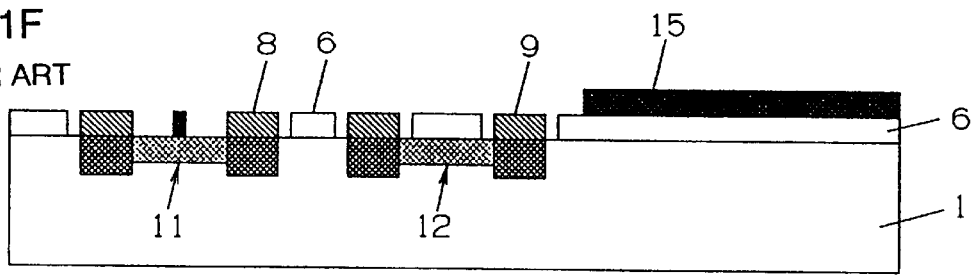
Figure 1G:
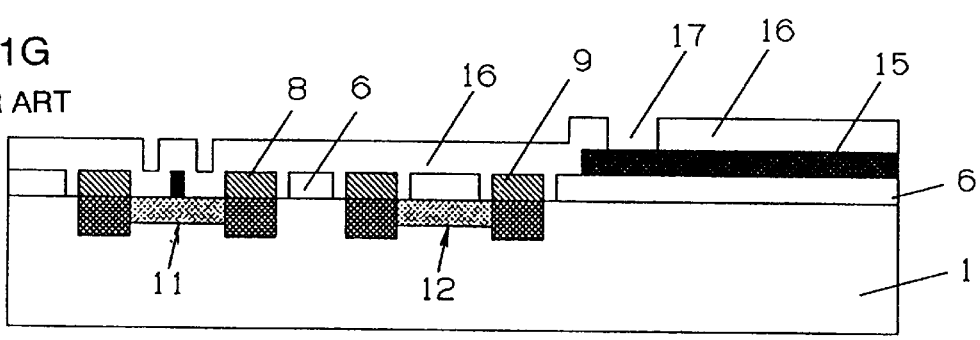
Figure 1H:
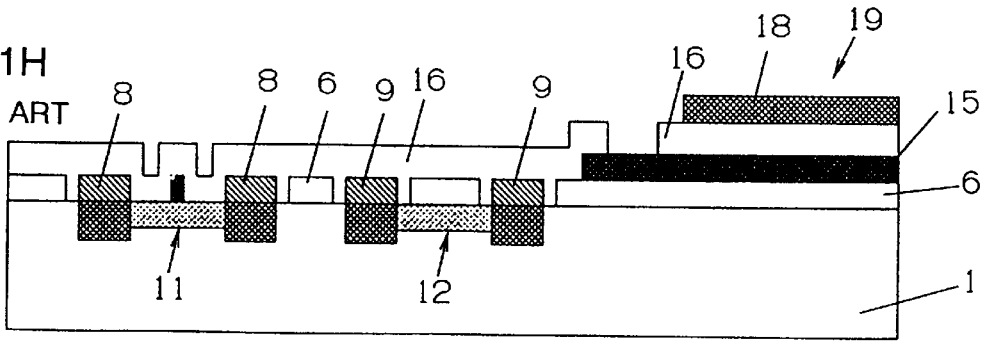
Figure 2A:
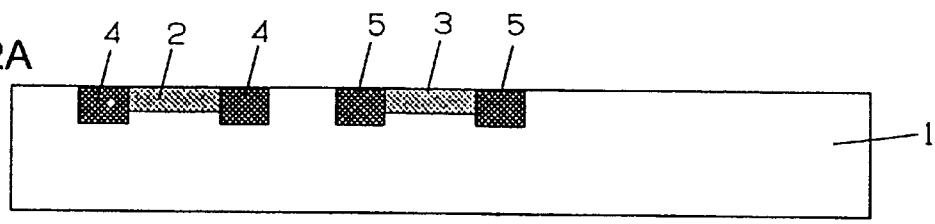
FIGS. 2A through 2H are schematic sectional views illustrating the structure and production method for a semiconductor device according to an embodiment of the present invention.

The structure of a semiconductor device having an FET, a semiconductor resistor element, and a MIM capacitor according to an embodiment of the present invention, and a method of producing the same will be described below with reference with FIGS. 2A through 2H. First, Si is doped in the surface layer of a semi-insulating GaAs substrate 1, and activated by annealing to form an active layer (n-type region) 2 and a semiconductor resistor layer (n-type region) 3. Further, Si is doped at a high concentration in the opposite-side areas of each of the active layer 2 and the semiconductor resistor layer 3, and activated by annealing to form contact layers ($n^+$ regions) 4, 5 (FIG. 2A).

Figure 2B:
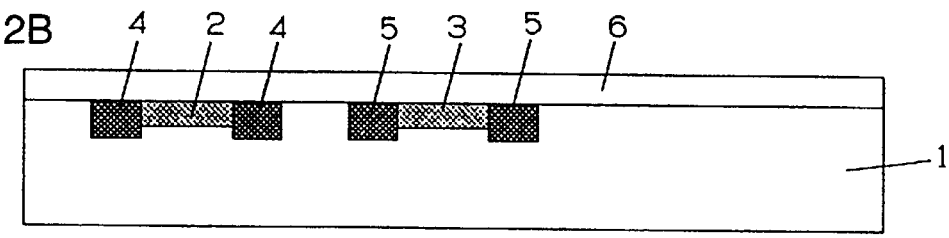
Figure 2C:
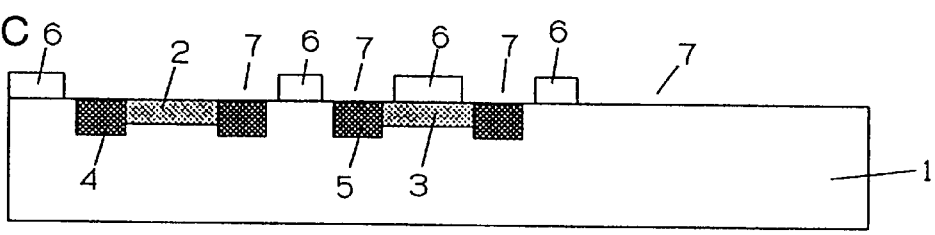

Succeedingly, an SiNx film 6 is formed on the whole surface of the GaAs substrate 1 (FIG. 2B). The SiNx film 6 is selectively removed by photolithography and an etching process to form openings 7 in the areas thereof where an FET, a semiconductor resistor element, and a capacitor are to be formed (FIG. 2C).

Figure 2D:
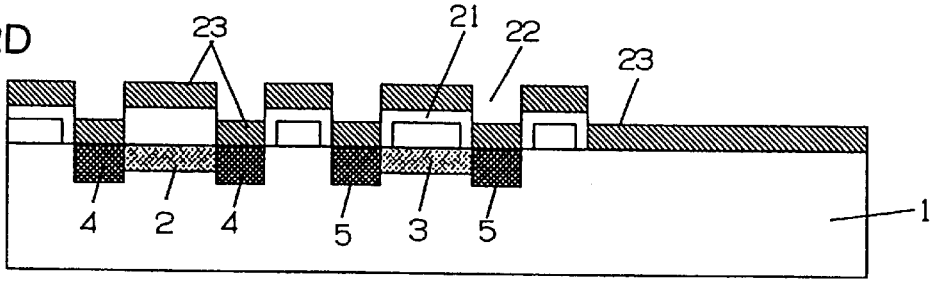
Figure 2E:
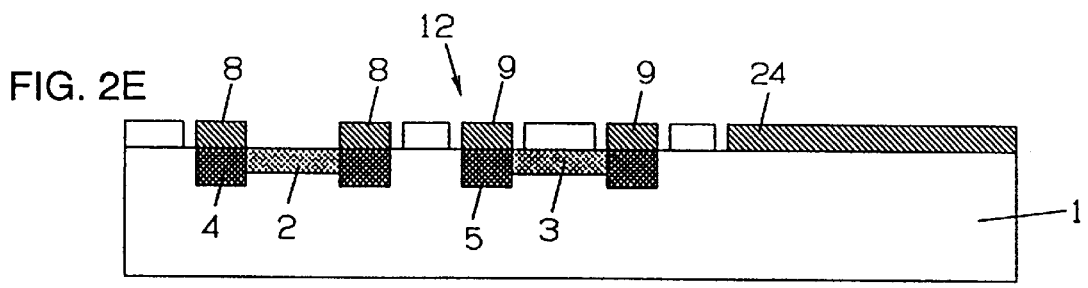

Then, a photoresist 21 is applied to the surface of the GaAs substrate 1, and provided with openings 22 by removing the areas thereof where the ohmic electrodes (source and drain electrodes) of the FET, the ohmic electrodes (terminal electrodes) of a semiconductor resistor element, and the lower layer electrode of a capacitor are to be formed. A metallic material 23 for the ohmic electrodes is vapor deposited thereon (FIG. 2D). As regards the metal material 23 for the ohmic electrodes, AuGe (100 nm thick), Ni (30 nm thick), and Au (100 nm thick) are sequentially deposited. Then, the photoresist 21 is removed by etching. By lifting-off, the ohmic electrodes 8 of the FET, the ohmic electrodes 9 of the semiconductor resistor element, and the lower layer electrode 24 of the capacitor are formed, and heat treated at 400° C. for 5 minutes in an $N_2$ atmosphere, so that the ohmic electrodes 8, 9 are rendered an ohmic contact to the contact layers 4, 5 and the lower layer electrode 24 is rendered an ohmic contact to the GaAs substrate 1 (FIG. 2E). Thus, the semiconductor resistor element 12 is formed on the GaAs substrate 1.

Simultaneously, a wiring is formed between the lower layer electrode 24 of the capacitor, the ohmic electrodes 8 of the FET, and the ohmic electrodes 9 of the semiconductor resistor element 12, by use of the same metallic material as that of the ohmic electrodes 8, 9 and the like. If a heterojunction bipolar transistor (HBT) and a diode are formed on the semiconductor substrate, the ohmic electrodes (emitter and collector electrodes) of the HBT and the ohmic electrode (anode electrode) of the diode can be simultaneously formed by the above-described process.

Figure 2F:
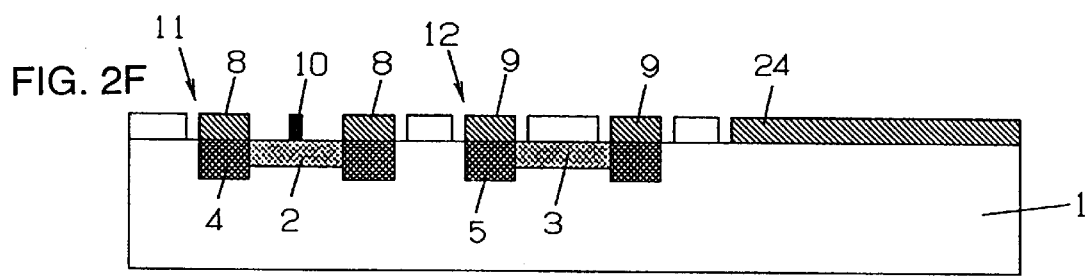

Succeedingly, a Schottky electrode (gate electrode) 10 is formed on the active layer 2 in the FET region (FIG. 2F). Thus, an FET 11 is formed on the GaAs substrate 1.

Figure 2G:
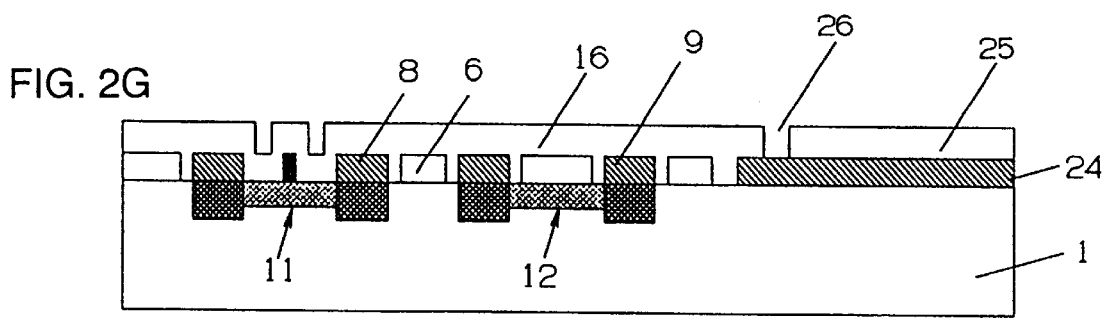
Figure 2H:
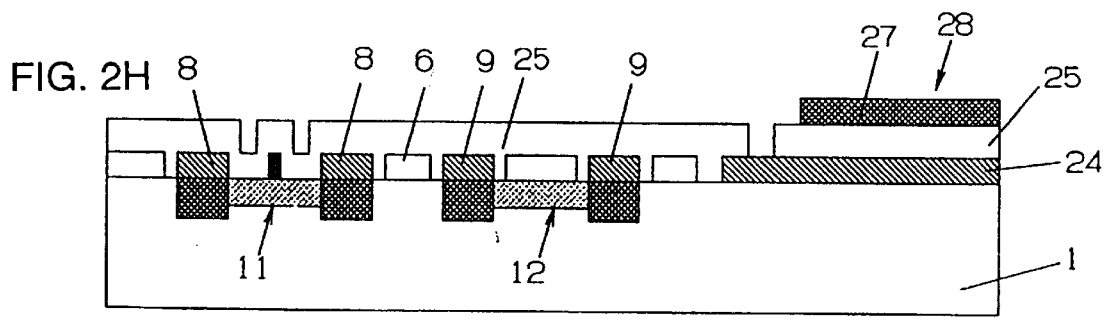

Then, the whole of the GaAs substrate 1 is covered with an SiNx film 25. The SiNx film 25 is provided with an opening 26 for wiring the lower layer electrode (FIG. 2G). Further., on the SiNx film 25, by the processes of photolithography, the vapor deposition of an electrode material (Ti, Pt, and Au), and lifting-off, an upper layer electrode 27 made of Ti/Pt/Au is so formed as to be opposite to the lower layer electrode 24 (FIG. 2H). Thus, an MIM capacitor 28 is formed on the GaAs substrate 1 having a structure in which the SiNx film (dielectric layer) 25 is sandwiched between the upper layer electrode 27 and the lower layer electrode 24.

According to conventional thought, if the electrodes of the capacitor are formed with the same metallic material as the ohmic electrode, the breakdown voltage characteristics will be deteriorated, since the surface roughness of the ohmic electrodes is increased by the heat treatment, and therefore, the electrodes will be unavailable for the capacitor. However, as described above, with the lower layer electrode 24 of the capacitor 28 formed with the same metallic material as that of the ohmic electrodes 8 and 9, good capacitor characteristics can be obtained similarly to the capacitor having the lower layer and upper layer electrodes formed with a metallic material different from that of the ohmic electrodes 8 and 9.

As seen in the above description, according to the semiconductor device having the above structure, the ohmic electrodes 8 and 9 of FET 11 and the semiconductor resistor element 12, and the lower layer electrode 24 of the capacitor 28 can be simultaneously formed with the same material. Accordingly, the number of process parameters for control of the photolithographic conditions, the vapor deposition conditions of an electrode metal, and the like can be reduced. One step in the process of forming the electrodes during production of the semiconductor device can be obviated. In addition, the wiring for connecting the elements such as FET, the resistor, and the like to the lower layer electrode of the capacitor can be simultaneously formed with the same metal material as the ohmic electrodes. Therefore, it is unnecessary to carry out the process of forming the complicated wiring by use of a separate wiring pattern. Thus, the process of producing the semiconductor device can be simplified, and the production cost can be reduced. In addition, as the number of the processes is reduced, variations in its characteristics can be reduced, and the reliability of its electrical characteristics can be enhanced.

Second Embodiment

Figure 3A:
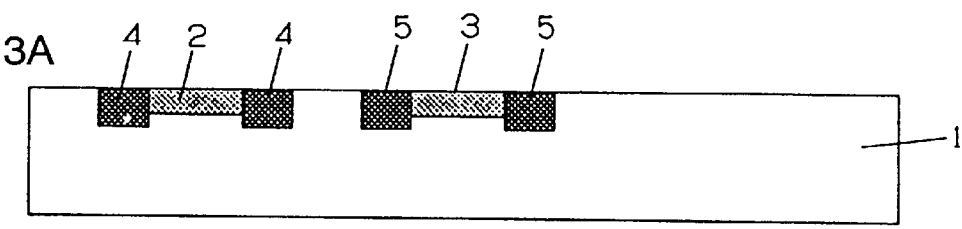
FIGS. 3A through 3H are schematic sectional views illustrating the structure and production method for a semiconductor device according to a further embodiment of the present invention.

Hereinafter, the structure of a semiconductor device according to a further embodiment of the present invention and a method of producing the same will be described with reference to FIGS. 3A through 3H. First, Si is doped in the surface layer of the semi-insulating GaAs substrate 1 by ion implantation, and activated by annealing to form the active layer 2 and the semiconductor resistor layer 3. Further, Si is doped at a high concentration in the opposite-side areas of each of the activate layer 2 and the semiconductor resistor layer 3 and activated by annealing to form the contact layers 4, 5 (FIG. 3A).

Figure 3B:
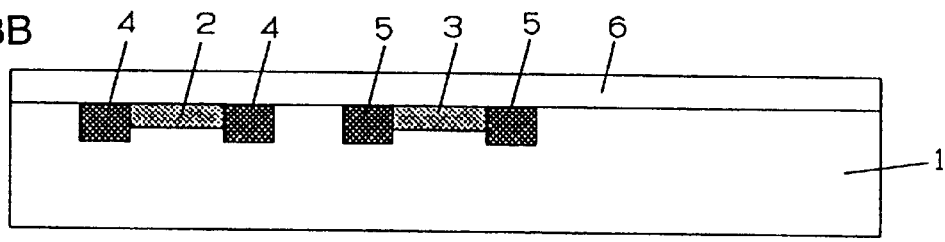
Figure 3C:
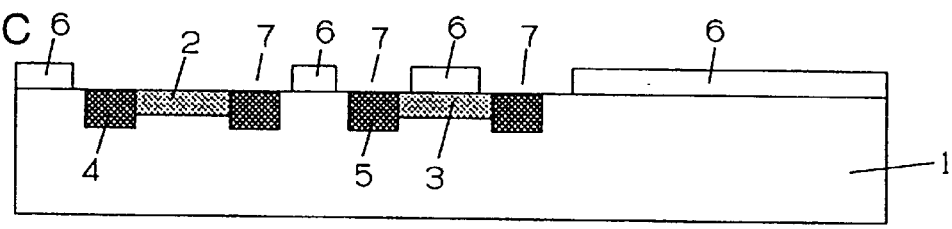

Then, the SiNx film 6 is formed on the whole surface of the GaAs substrate 1 (FIG. 3B). The SiNx film 6 is selectively removed by photolithography and an etching process to form the openings 7 in the areas thereof where an FET and the semiconductor resistor element are to be formed (FIG. 3C).

Figure 3D:
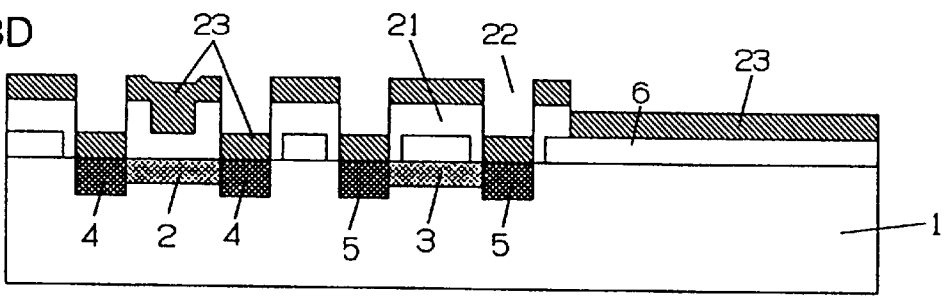
Figure 3E:
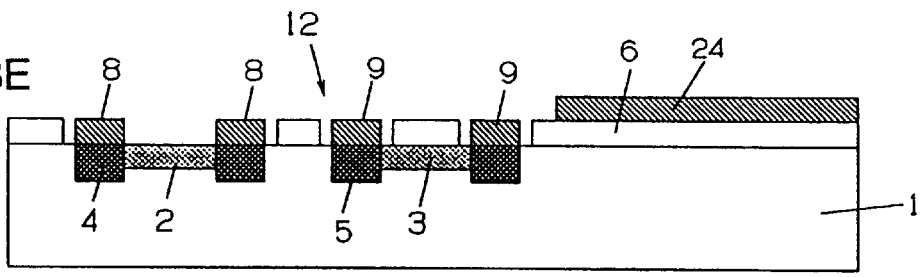

Then, the photoresist 21 is applied to the surface of the GaAs substrate 1, and provided with the openings 22 by removing the areas thereof where the ohmic electrodes (source and drain electrodes) of the FET, the ohmic electrodes (terminal electrodes) of the semiconductor resistor element, and the lower layer electrode of the capacitor are to be formed. The metallic material 23 for the ohmic electrodes is vapor deposited thereon (FIG. 3D). As regards the metallic material 23 for the ohmic electrodes, AuGe (100 nm thick), Ni (30 nm thick), and Au (100 nm thick) are sequentially laminated. Then, the photoresist 21 is removed by etching. By lifting-off, the ohmic electrodes 8 of FET, the ohmic electrodes 9 of the semiconductor resistor element, and the lower layer electrode 24 of the capacitor are simultaneously formed, and heat treated at 400° C. for 5 minutes in an $N_2$ atmosphere, so that the ohmic electrodes 8, 9 are rendered an ohmic contact to the contact layers 4, 5 (FIG. 3E). Thus, on the GaAs substrate 1, the semiconductor resistor element 12 is formed, and on the SiNx film 6, the lower layer electrode 24 of the capacitor is formed. At the same time, the wiring between the lower layer electrode 24 of the capacitor, the ohmic electrodes 8 of FET, and the ohmic electrodes 9 of the semiconductor resistor element 12 is formed with the same metallic material of the ohmic electrodes 8 and 9 and the like.

Figure 3F:
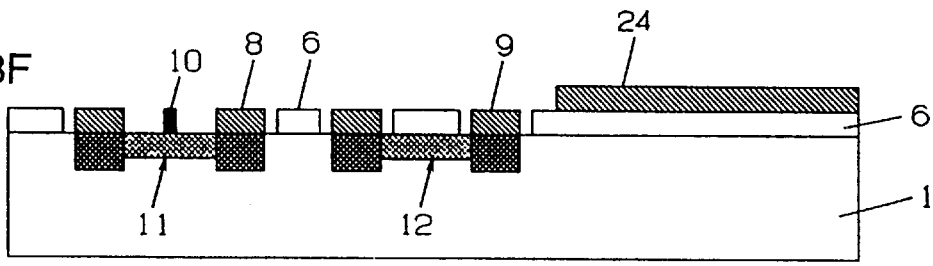

Further, the Schottky electrode (gate electrode) 10 is formed on the active layer 2 in the FET region (FIG. 3F). Thus, the FET 11 is formed on the GaAs substrate 1.

Figure 3G:
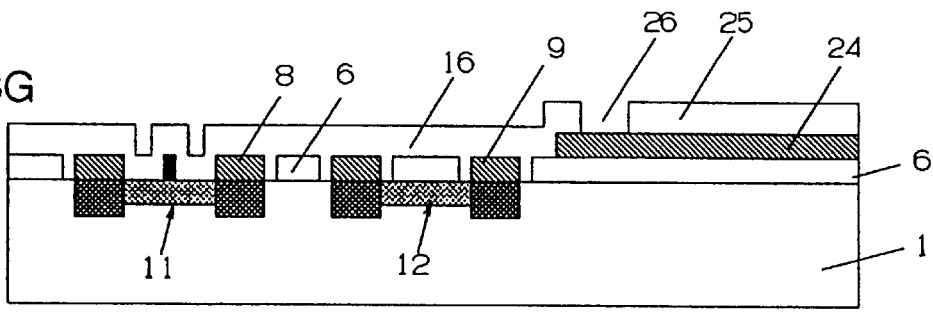
Figure 3H:
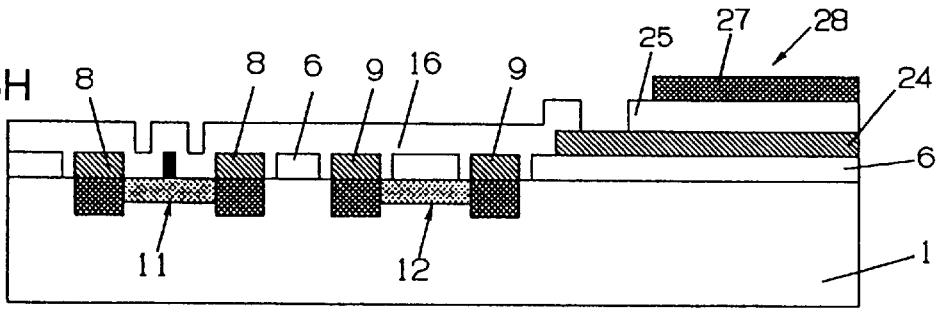

Then, the whole of the GaAs substrate 1 is covered with the SiNx film 25. The SiNx film 25 is provided with an opening 26 for wiring (FIG. 3G). Further, on the SiNx film 25, by the processes of photolithography, vapor deposition of the electrode material (Ti, Pt, and Au), and lifting-off, the upper layer electrode 27 made of Ti/Pt/Au is so formed as to be opposite to the lower layer electrode 24 (FIG. 3H). Thus, an MIM capacitor 28 is formed on the GaAs substrate 1 having a structure in which the SiNx film 25 is sandwiched between the upper layer electrode 27 and the lower layer electrode 24.

When the ohmic electrodes formed on the GaAs substrate 1 are heat-treated for alloying, the surface roughness is increased. On the other hand, when the same metallic material as that of the ohmic electrodes, formed on the SiNx film is heat treated, the surface roughness is not deteriorated while a good morphology which is the same as that before the heat treatment is maintained. Accordingly, though the lower layer electrode 24 is formed with the same metal material as the ohmic electrodes 8 and 9, the reliability of the capacitor characteristics, such as withstand voltage characteristics and the like, can be sufficiently enhanced. Further, in the case where the lower layer electrode 24 is formed on the SiNx film 6,.the adhesion between the lower layer electrode 24 (AuGe/Ni/Au) and the SiNx film 6 can be enhanced by the alloying heat treatment. In addition, with the above-described structure, since the ohmic electrodes 8 and 9 and the lower layer electrode 24 of the capacitor 28 can be simultaneously formed, the production can be simplified, and the production cost can be reduced.

Third Embodiment

Figure 4A:
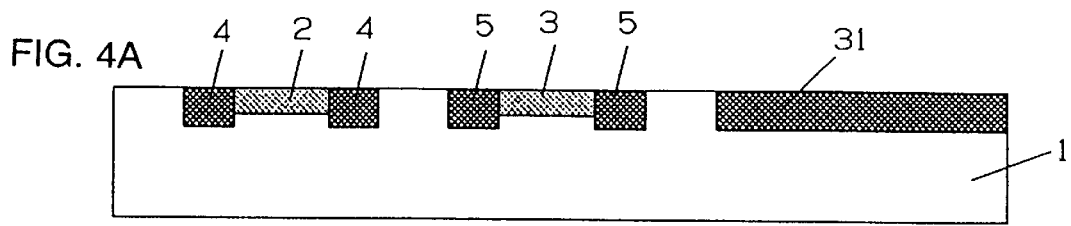
FIGS. 4A through 4E are schematic sectional views illustrating the structure and production method for a semiconductor device according to a still further embodiment of the present invention.

Hereinafter, the structure of a semiconductor device according to a still further embodiment of the present invention, and a method of producing the same will be described with reference to FIGS. 4A through 4E. First, Si is doped in the surface layer of the semi-insulating GaAs substrate 1 by ion implantation, and activated by annealing to form the active layer 2 and the semiconductor resistor layer 3. Further, Si is doped at a high concentration in the opposite-side areas of each of the active layer 2 and the semiconductor resistor layer 3 and in the area where the capacitor is to be formed, and activated by annealing to form the contact layers 4, 5 and the lower layer electrode ($n^+$ region) 31 of the capacitor (FIG. 4A).

Figure 4B:
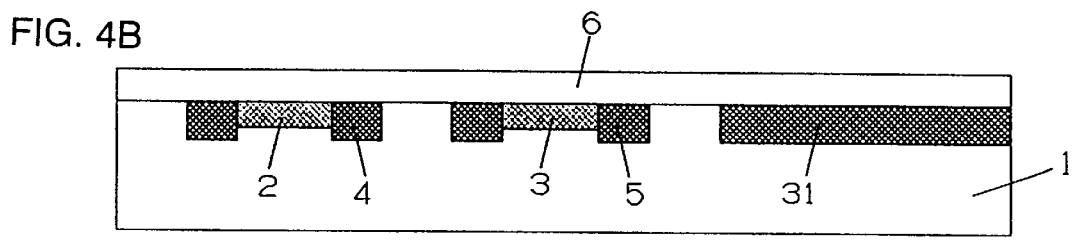
Figure 4C:
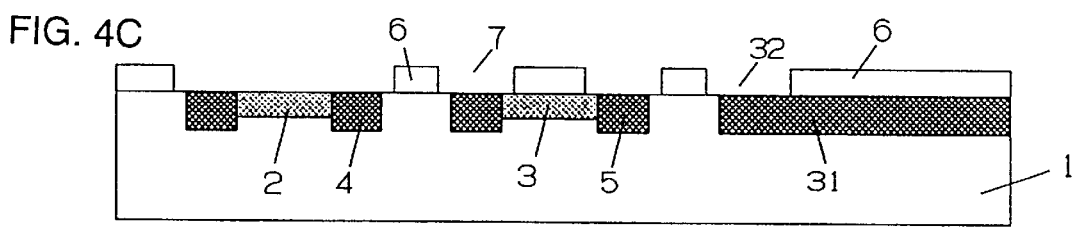

Then, the SiNx film 6 is formed on the whole surface of the GaAs substrate 1 (FIG. 4B). The SiNx film 6 is selectively removed by photolithography and an etching process to provide openings 7 in the areas thereof where FET, the semiconductor resistor element, and the like are to be formed (FIG. 4C). Simultaneously,in the SiNx film 6, an opening 32 is formed for exposing a part of the lower layer electrode 31.

Figure 4D:
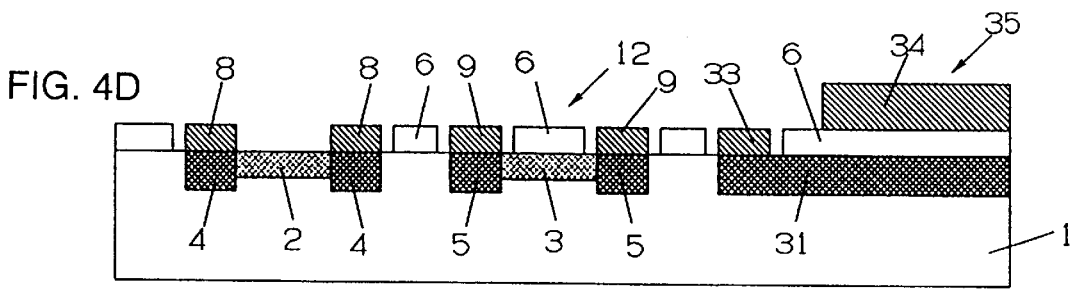

Then, the photoresist (not shown) is applied to the surface of the GaAs substrate 1, and provided with openings by removing the areas thereof where the ohmic electrodes (source and drain electrodes) of the FET, the ohmic electrodes (terminal electrodes) of the semiconductor resistor element, an ohmic electrode (terminal electrode) for the lower layer electrode 31, and the upper layer electrode of the capacitor are to be formed. A metallic material for the ohmic electrodes is vapor deposited thereon. As regards the metal material for the ohmic electrodes, AuGe (100 nm thick), Ni (30 nm thick), and Au (100 nm thick) are sequentially laminated. Then, the photoresist is removed by etching. By lifting-off, the ohmic electrodes 8 of the FET, the ohmic electrodes 9 of the semiconductor resistor element, the ohmic electrode 33 for the lower layer electrode 31, and the upper layer electrode 34 of the capacitor are formed, and heat treated at 400° C. for 5 minutes in an $N_2$ atmosphere, so that the ohmic electrodes 8, 9, and 33 are rendered an ohmic contact to the contact areas 4, 5 and lower layer electrode, respectively (FIG. 4D). Thus, on the SiNx film 6, the upper layer electrode 34 is formed, and on the GaAs substrate 1, the semiconductor resistor element 12 and a capacitor 35 are formed. Simultaneously, a wiring is formed between the upper layer electrode 34 of the capacitor 35, the ohmic electrodes 33 for the lower layer electrode 31, the ohmic electrodes 8 of the FET, and the ohmic electrodes 9 of the semiconductor resistor element 12, with the same metal material of the ohmic electrodes 8, 9, 33, or the like.

Figure 4E:
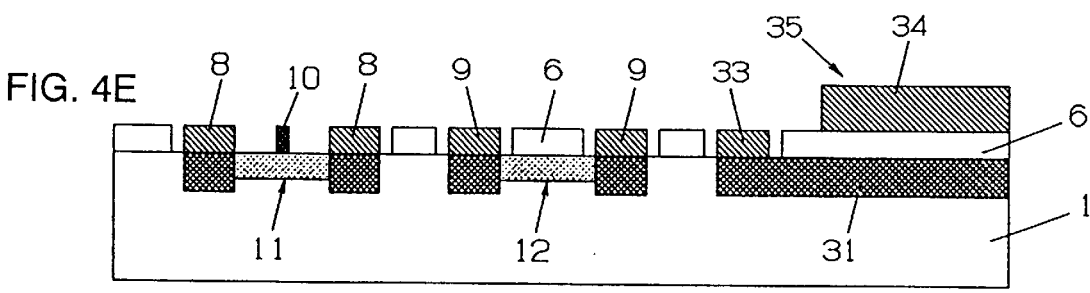

Succeedingly, the Schottky electrode (gate electrode) 10 is formed on the active layer 2 in the FET region (FIG. 4E). Thus, an FET 11 is formed on the GaAs substrate.

Also, in this case, the upper layer electrode 34 of the capacitor 35, together with the ohmic electrodes 8, 9, and 33, is simultaneously formed by the same process. Accordingly, the production process for the semiconductor device can be simplified, and the production cost can be reduced. In addition, as the upper layer electrode 34 is formed on the SiNx film 6, a good morphology which is the same as that before the heat treatment can be maintained, without deterioration of the surface roughness, when the alloying heat treatment is carried out. Therefore, the reliability of the capacitor characteristics, such as withstand voltage characteristics and the like can be sufficiently enhanced. In addition, in the case that the upper layer electrode 34 is formed on the SiNx film 6, the adhesion of the upper layer electrode 34 (AuGe/Ni/Au) to the SiNx film 6 can be enhanced by the alloying heat treatment.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A GaAs semiconductor device comprising:
   a GaAs substrate,
   a capacitor having a pair of electrodes opposite to each other through a dielectric layer formed on said GaAs substrate; and
   an element other than a capacitor formed on said GaAs substrate, said element including a first portion of said GaAs substrate and a first ohmic electrode which is in ohmic contact with said first portion of said GaAs substrate and said first ohmic electrode and one of the electrodes of said capacitor being formed of the same metallic material, wherein said one electrode of said capacitor and said first ohmic electrode each contain at least Au, Ge, and Ni.

2. A GaAs semiconductor device comprising:
   a GaAs substrate;
   a capacitor having a pair of electrodes opposite to each other through a dielectric layer formed on said GaAs substrate; and
   an element other than a capacitor formed on said GaAs substrate, said element including a first portion of said GaAs substrate and a first ohmic electrode which is in ohmic contact with said first portion of said GaAs substrate and said first ohmic electrode and one of the electrodes of said capacitor being formed of the same metallic material, wherein said element includes a second portion of said GaAs substrate and a second ohmic electrode which is in ohmic contact with a second portion of said GaAs substrate, said second ohmic electrode being made of the same metallic material as said first ohmic electrode and said one electrode of said capacitor.

3. A GaAs semiconductor device according to claim 1 or claim 2, further comprising an insulating film formed over said GaAs substrate, said one electrode of said capacitor being formed on said insulating film.

4. A GaAs semiconductor device according to claim 1 or claim 2, wherein said electrode of said capacitor is a lower electrode.

5. A GaAs semiconductor device according to claim 1 or claim 2, wherein said electrode of said capacitor is an upper electrode.

6. A GaAs semiconductor device according to claim 2, wherein said element is a field effect transistor and said first and second portions of said GaAs substrate are a source contact area and a drain contact area, respectively.

* * * * *